United States Patent
Mueller et al.

(10) Patent No.: US 10,992,162 B2
(45) Date of Patent: Apr. 27, 2021

(54) METHOD FOR DETECTING A STATE OF A VEHICLE ELECTRIC SYSTEM

(71) Applicant: Robert Bosch GmbH, Stuttgart (DE)

(72) Inventors: Manuel Mueller, Kisslegg (DE); Miriam Riederer, Fellbach (DE); Udo Schulz, Vaihingen/Enz (DE); Wolfgang Fischer, Renningen (DE); Zoltan Ersek, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 13 days.

(21) Appl. No.: 15/779,354

(22) PCT Filed: Oct. 28, 2016

(86) PCT No.: PCT/EP2016/076024
§ 371 (c)(1),
(2) Date: May 25, 2018

(87) PCT Pub. No.: WO2017/089066
PCT Pub. Date: Jun. 1, 2017

(65) Prior Publication Data
US 2018/0304751 A1    Oct. 25, 2018

(30) Foreign Application Priority Data
Nov. 26, 2015  (DE) .................. 10 2015 223 387.1

(51) Int. Cl.
*H02P 9/00* (2006.01)
*H02J 7/24* (2006.01)
(Continued)

(52) U.S. Cl.
CPC .................. *H02J 7/24* (2013.01); *H02P 9/30* (2013.01); *H02P 29/0241* (2016.02); *B60L 3/0023* (2013.01); *G01R 31/007* (2013.01)

(58) Field of Classification Search
CPC ... B60L 3/0023; G01R 31/392; G01R 31/007; H02J 7/242; H02J 7/24; H02P 29/0241;
(Continued)

(56) References Cited

U.S. PATENT DOCUMENTS 3,373,333 A * 3/1968 Eckard ...................... H02P 9/30
320/123
9,608,555 B2 * 3/2017 Magini ................... H02P 27/06
(Continued)

FOREIGN PATENT DOCUMENTS

DE          10309322        9/2004
DE        102015211933     12/2016
(Continued)

OTHER PUBLICATIONS

International Search Report for Application No. PCT/EP2016/076024 dated Feb. 3, 2017 (English Translation, 4 pages).

*Primary Examiner* — Julio C. Gonzalez
(74) *Attorney, Agent, or Firm* — Michael Best & Friedrich LLP

(57) ABSTRACT

Method for detecting a state of an electric system (150) in a motor vehicle, said electric system (150) comprising a generator unit that includes an electric machine (100) with a rotor winding (110) and a stator winding (120) as well as a rectifier (130) which is connected to the electric machine (100) and via which the electric system (150) is connected to the electric machine (100); in said method, a decision about the current state of the electric system (150), especially about the availability of a battery (200) of the electric system, is made in accordance with an excitation current ($I_E$) flowing through the rotor winding (110) of the electric machine (100).

14 Claims, 4 Drawing Sheets

(51) Int. Cl.
*H02P 9/30* (2006.01)
*H02P 29/024* (2016.01)
*B60L 3/00* (2019.01)
*G01R 31/00* (2006.01)

(58) Field of Classification Search
CPC .......... H02P 9/30; Y02T 10/642; Y02T 10/64; B60R 11/02
See application file for complete search history.

(56) References Cited

U.S. PATENT DOCUMENTS

| | | | | |
|---|---|---|---|---|
| 9,682,673 | B2* | 6/2017 | Sakata | H02J 7/16 |
| 2001/0009147 | A1* | 7/2001 | Takashima | F02D 41/22 |
| | | | | 123/406.14 |
| 2001/0054890 | A1 | 12/2001 | Thibedeau et al. | |
| 2006/0108987 | A1 | 5/2006 | Aoyama | |
| 2007/0114976 | A1* | 5/2007 | Inokuchi | H02J 7/1461 |
| | | | | 322/28 |
| 2011/0080676 | A1* | 4/2011 | Yoshida | G01R 31/025 |
| | | | | 361/30 |
| 2011/0204885 | A1* | 8/2011 | Le Goff | B60Q 11/005 |
| | | | | 324/244 |
| 2012/0326675 | A1* | 12/2012 | Tateno | H01M 10/06 |
| | | | | 320/138 |
| 2016/0053765 | A1* | 2/2016 | Schreiber | F04D 27/008 |
| | | | | 417/44.11 |

FOREIGN PATENT DOCUMENTS

| | | | | |
|---|---|---|---|---|
| EP | 1152249 | | 11/2001 | |
| EP | 1906523 | | 4/2008 | |
| FR | 2970609 | | 7/2012 | |
| GB | 2341691 | | 3/2000 | |
| WO | WO-9611817 A2 * | 4/1996 | ............... | H02J 1/14 |
| WO | 03021280 | | 3/2003 | |
| WO | 2004042411 | | 5/2004 | |

* cited by examiner

METHOD FOR DETECTING A STATE OF A VEHICLE ELECTRIC SYSTEM

BACKGROUND OF THE INVENTION

The present invention relates to a method for detecting a state of a vehicle electric system and to an arithmetic unit, in particular a generator controller, as well as to a computer program to carry out said method.

Motor vehicles are equipped with an electric system which is supplied with voltage via an electric machine, e.g. an externally excited synchronous machine, operated as a generator. In order to control the electric system voltage, an excitation current of the electric machine can be controlled. The electric machine is generally connected to the electric system via a rectifier and with said rectifier forms a generator unit. Errors can occur in such generator units in particular in the connection of a battery or in the battery itself, which errors should be detected whenever possible. It is likewise desirable to detect the type of connection of the battery.

The German patent application DE 10 2015 211 933, which is not pre-published, discloses a method for detecting an error in a generator unit, which comprises an electric machine with a rotor winding and a stator winding and a rectifier connected thereto, via which the electric machine is connected to an electric system, wherein a voltage of the electric m system is controlled to a target value via an excitation current flowing through the rotor winding of the electric machine and a plot of the excitation current is monitored, and wherein it is concluded that there is an error in the generator unit if an oscillatory plot of the excitation current is detected, wherein a magnitude of the oscillation lies above a threshold value.

SUMMARY OF THE INVENTION

According to the invention, a method for detecting a state in a vehicle electric system as well as an arithmetic unit and a computer program for carrying out said method having the features of the independent patent claims are proposed. Advantageous embodiments are the subject matter of the dependent claims as well as the following description.

In a first aspect, the invention relates to a method for detecting a state of an electric system of a motor vehicle, said electric system comprising a generator unit that includes an electric machine with a rotor winding and a stator winding as well as a rectifier which is connected to the electric machine and via which the electric system is connected to the electric machine. That means that the vehicle electric system is connected to a high-side terminal B+ and a low-side terminal B− of the rectifier. In said method, a decision about the current state of the electric system is made in accordance with an excitation current flowing through the rotor winding. It has been recognized that the state of the vehicle electric system has a significant influence on the behavior of the excitation current via the inductive coupling between stator and rotor of the generator unit. It has particularly been recognized that conclusions can be drawn from the behavior of the excitation current about the availability of a battery of the vehicle electric system, in particular about how long a connection line is from the rectifier to the battery, if the connection is possibly defective or whether an error is present in the battery.

The state of the vehicle electric system can be particularly clearly derived from a size of an oscillation amplitude of the excitation current.

It is possible to keep parameters in the generator unit which determine how, e.g., a control of the excitation current is performed in order to adjust the generator voltage to a predeterminable target value.

If a battery-less operation is present, it is advantageous to change these parameters, e.g., by switching to a predefined second set of parameters.

It is likewise possible that different parameter sets are kept depending on how long the length of the connection line to the battery is.

Provision is therefore made in further aspects for a detection to be made in accordance with the excitation current, in particular in accordance with the size of the oscillation amplitude of the excitation current whether a long or a short supply line is present and/or whether the connection to the battery is defective. The latter is apparent by a rapid increase in the oscillation amplitude at the point in time at which the defect occurs.

Furthermore, it is advantageous to detect whether a sulfation of the battery is present or increases, which is indicated by a sharp increase in the oscillation amplitude.

Provision is therefore made in further aspects for the oscillation amplitude to be monitored for an increase and for a decision to be made in accordance with the duration of the increase whether the connection of the battery is defective and/or whether sulfation is present.

If the increase is sufficiently rapid, provision can then be made for a battery-less operation to be detected. Corresponding parameters for operating the generator unit can then optionally be set.

Alternatively or additionally, provision can be made for it to be detected that the sulfation of the battery is present if the increase is sufficiently slow.

It is then possible to charge the battery in a pulsed manner in order to reduce the sulfation. This advantageously occurs during a service interval. That is why it is advantageous to store the status, that sulfation is present, in the generator unit or respectively to transmit said status to another control device which can be coupled to the generator unit via a bus system, such as, for example an engine control device.

An inventive arithmetic unit, in particular a generator controller, e.g. a control device of a motor vehicle, is, in particular in a program technical manner, equipped to carry out a method according to the invention. The arithmetic unit can however also be equipped completely or entirely with hardware for carrying out the method.

The implementation of the method in the form of a computer program is also advantageous because this entails particularly low costs, in particular if a control device that carries out the program can be used for other tasks and therefore is already present in any event.

Further advantages and embodiments of the invention ensue from the description and the attached drawings.

BRIEF DESCRIPTION OF THE DRAWINGS

The invention is schematically depicted in the drawings on the basis of an exemplary embodiment and is described below with reference to the drawings.

DETAILED DESCRIPTION

Figure 1:
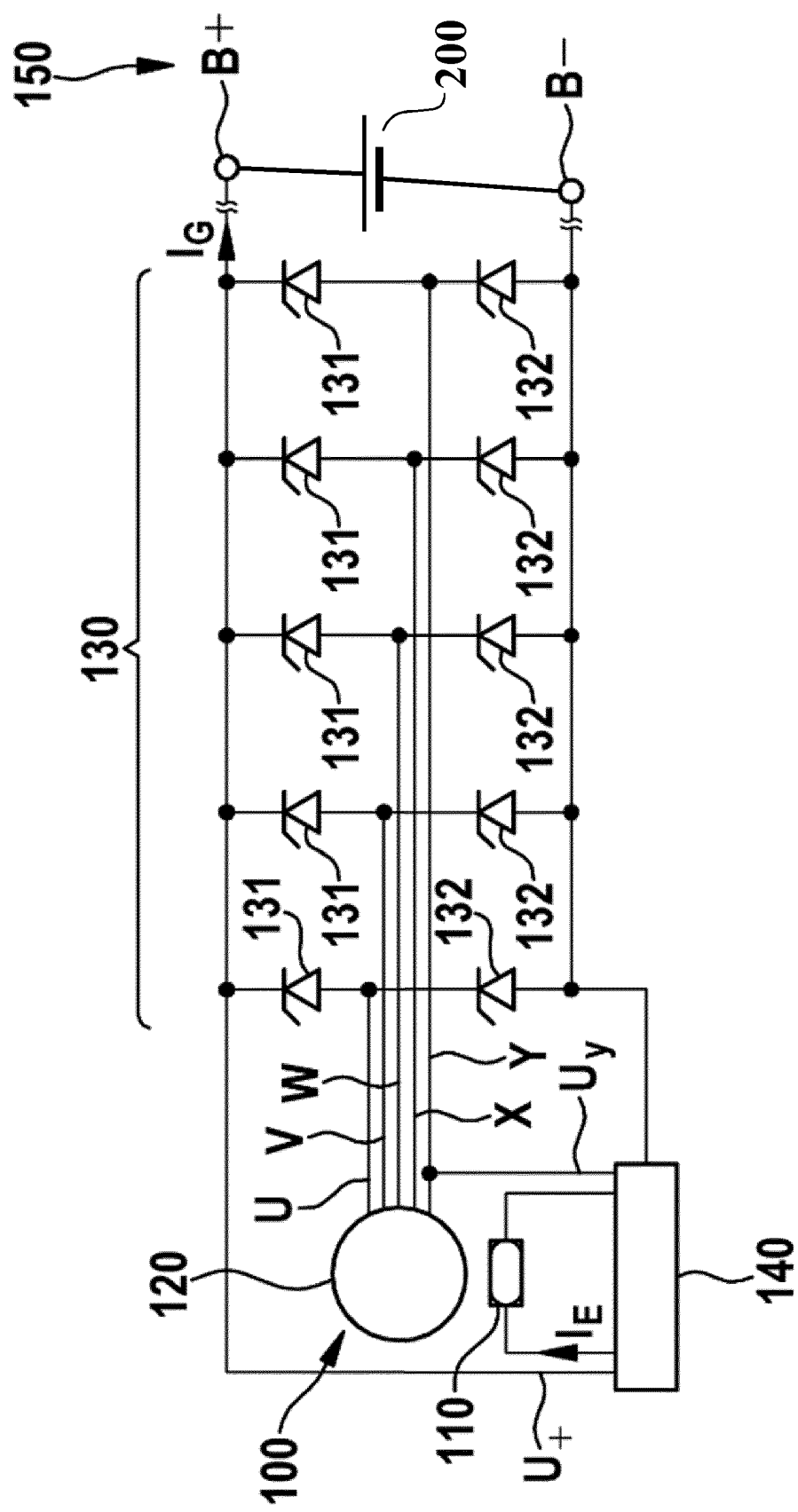
FIG. 1 shows schematically a generator unit that includes an electric machine, a rectifier and a generator controller and is connected to a vehicle electric system, in which generator unit a method according to the invention can be carried out.

In FIG. 1, a generator unit comprising an electric machine 100 with a rectifier 130 and an arithmetic unit 140 which is designed as a generator controller and in which a method according to the invention can be carried out is schematically shown. The electric machine 100 has a rotor winding or respectively an excitation winding 110 and a stator winding 120 and is used in the present example as a generator for the voltage supply for an electric system 150 of a motor vehicle.

The electric machine 100 and thus the stator winding 120 thereof is designed here having five phases U, V, W, X and Y. Each of the five phases is connected via an associated diode 131 of the rectifier 130 to a positive side or respectively high-side B+ of the vehicle electric system 150 and via an associated diode 132 to a negative side or respectively low-side B− of the vehicle electric system 150. It goes without saying that the number five of the phases is selected here only by way of example and that a method according to the invention can also be carried out with another number of phases, e.g. 3, 6, 7 or more. It is likewise possible to use suitable semiconductor switches instead of the diodes.

The generator controller 140 supplies the rotor winding 110 with an excitation current. To this end, a switch can be provided in the generator controller 140, which switch is connected in series with the rotor winding 110 and sets the excitation current $I_E$, for example by means of a clocked control. Furthermore, the generator controller 140 has inputs for acquiring the vehicle electric system voltage with B+ and B− as well as a phase voltage, here the phase Y, with voltage $U_Y$. A current emitted by the electric machine 100 is denoted with the reference sign $I_G$.

The vehicle electric system 150 comprises a battery 200, which is connected between the high-side B+ and the low-side B− of the vehicle electric system 150.

Figure 2:
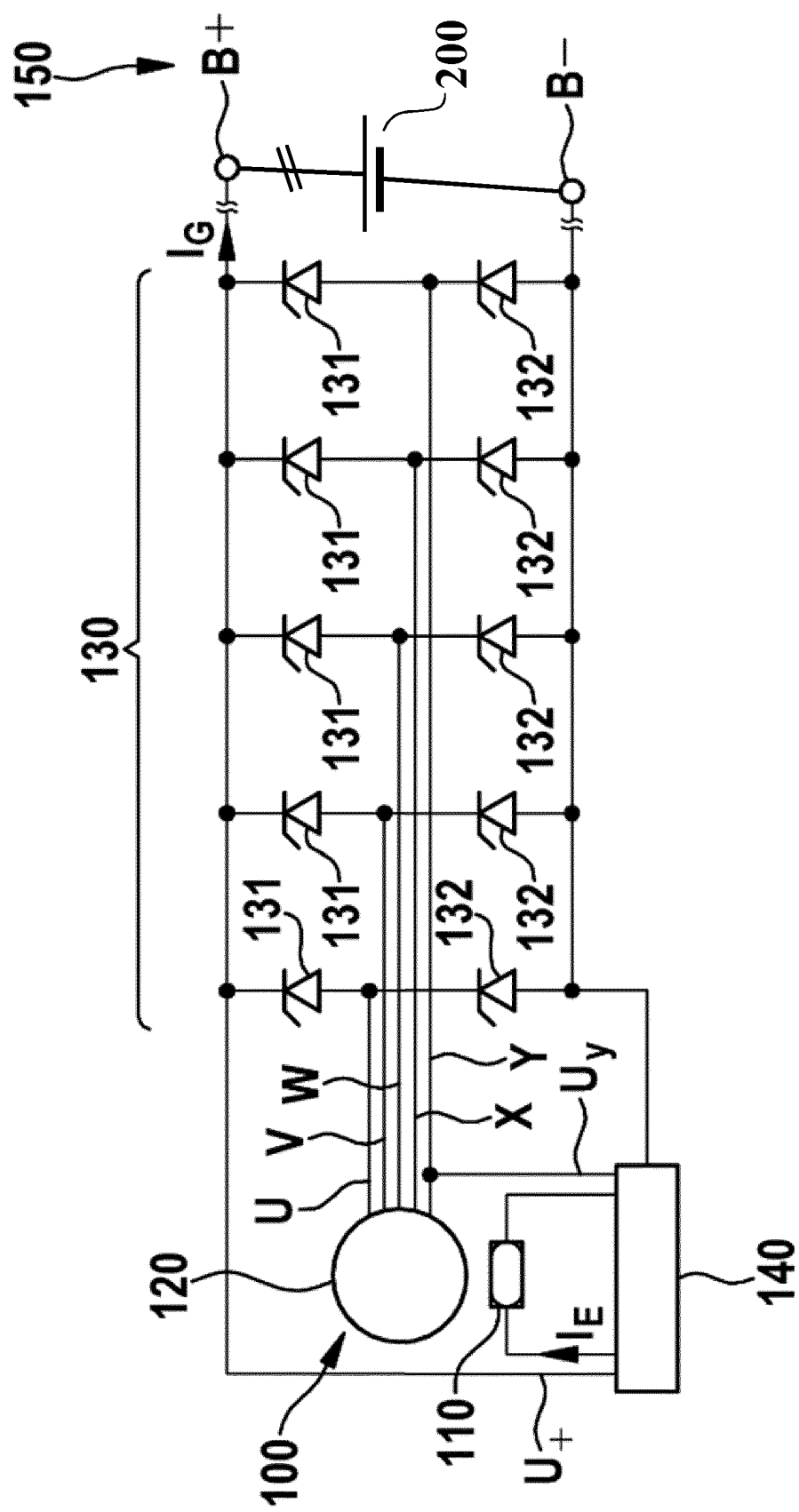
FIG. 2 shows the generator unit from FIG. 1 when there is an error in the vehicle electric system.

The generator unit with the vehicle electric system 150 shown in FIG. 1 is shown by way of example in FIG. 2. In FIG. 2, a battery-less operation is present as a result of an interruption in a line to the battery 200.

Figure 3:
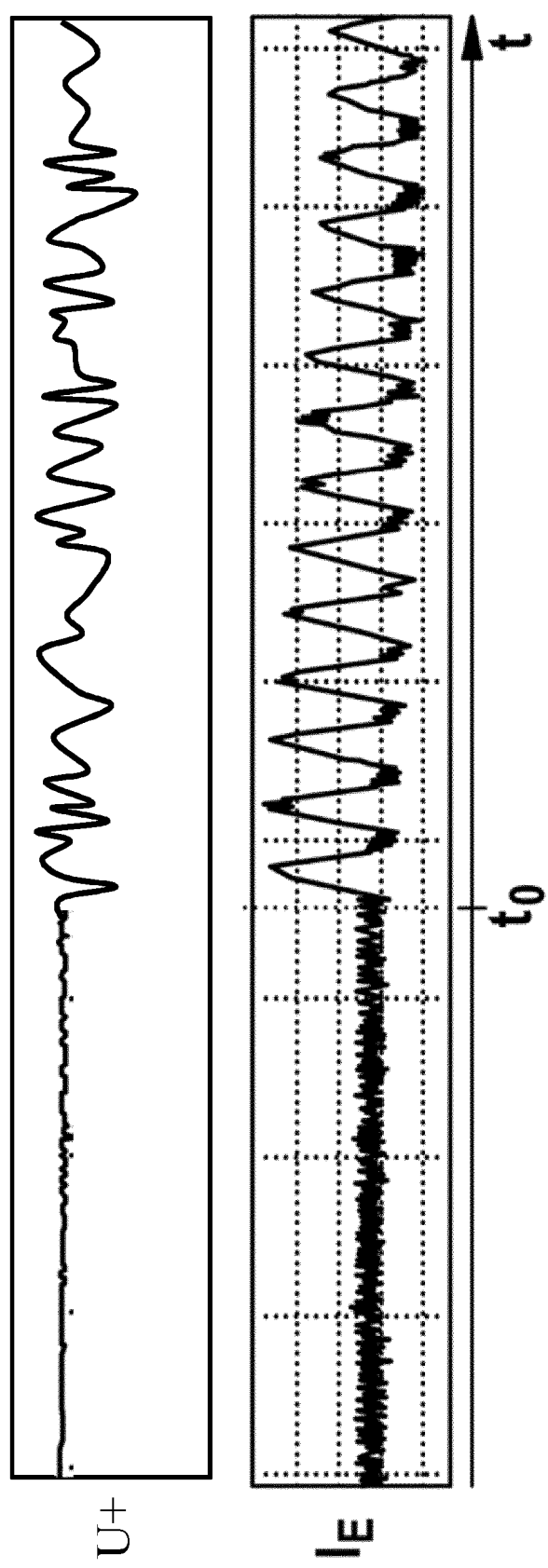
FIG. 3 shows the plot of the generator voltage and the excitation current when the error shown in FIG. 2 is present.

In FIG. 3, plots of the generator voltage U+ and the excitation current IE are shown in each case over the time t. A normal operation of the arrangement prevails prior to the point in time $t_0$, and the error shown in FIG. 2 occurs at the point in time $t_0$.

Due to the absence of buffering of the vehicle electric system voltage by the battery 200, the generator voltage U+ carries out significantly larger fluctuations after the point in time t0 than before. Such an error can, for example, be diagnosed by means of a Fourier analysis. It is, for example, possible to determine a frequency contribution of the plot of the generator voltage U+ in a predeterminable range of the frequency band. As soon as this frequency contribution is greater than a predeterminable threshold value, it can be concluded that the battery-less operation is present.

The Fourier analysis can, for example, be carried out by means of a discrete Fourier transform (DFT). It is particularly possible to provide an electronic chip in the generator controller 140, which chip carries out the calculations necessary for carrying out the DFT.

A significant oscillation with a high amplitude in comparison to the plot without errors can be seen in the excitation current IE. An unsymmetrical distribution of the phase currents results from the illustrated behavior of the generator voltage U+. The plot of the excitation current shown results from the unsymmetrical distribution of the phase currents after the error has occurred, which phase currents then contain a direct current component. With the rotation of the electric machine, these unequal direct current components are then transmitted to the rotor of the electric machine because the externally excited synchronous machine can be considered to be like a transformer, which on the one hand enables a coupling from the rotor to the stator, on the other hand however also a back coupling from the stator to the rotor. The excitation current thereby receives a significant alternating current component, whereby the conclusion that the error is present is possible.

Figure 4:
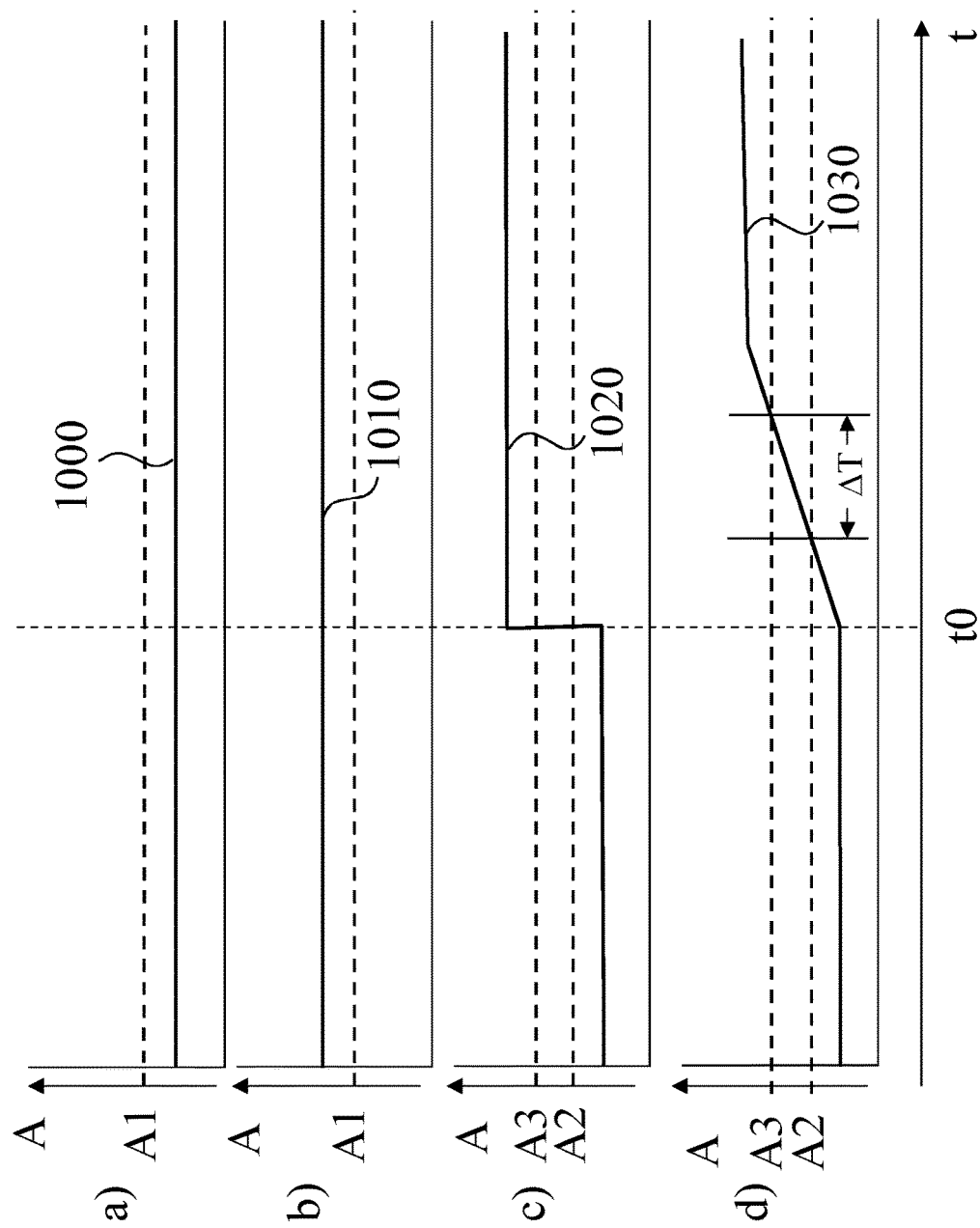
FIG. 4 shows plots of an oscillation amplitude of the excitation current during different operating states of the vehicle electric system.

In FIG. 4, the oscillation amplitude A of the excitation current IE in the errorless case is plotted schematically over the time for different operating states of the vehicle electric system 150. The oscillation amplitude A is, for example, provided by means of a difference between a maximum value and a minimum value of an oscillation period.

FIG. 4a) shows a plot 1000 of the oscillation amplitude A for an errorless state of the generator and the vehicle electric system 150, in which the battery 200 is mounted near to the generator, for example because generator and battery 200 are mounted in the engine compartment. The oscillation amplitude A is approximately constant and less than a first threshold value A1.

FIG. 4b) shows a plot 1010 of the oscillation amplitude A likewise for an errorless state of the generator and the vehicle electric system 150. In contrast to FIG. 4a) a case is depicted in FIG. 4b) in which the battery 200 is mounted at a significantly larger distance to the generator. This is, for example, the case if the generator is mounted at a front engine of the motor vehicle and the battery 150 is installed in the rear of the vehicle. The oscillation amplitude A is now greater than in the case illustrated in FIG. 4a), in particular greater than the first threshold value A1 as a result of the length of the supply line to the battery 150.

It is possible to identify where the battery 150 is installed in the vehicle on the basis of the size of the oscillation amplitude A. This method can, for example, take place in the generator controller 140. It is possible that, for example when the generator is first started, the size of the oscillation amplitude A is determined and a decision is made how the control parameters in the generator controller 140 are selected in accordance with this size. For example, it is possible that a first set of control parameters is kept for the case illustrated in FIG. 4a) and a second set of control parameters is kept for the case illustrated in FIG. 4b), wherein the first or the second set of control parameters is activated depending on whether the oscillation amplitude A is less than the first threshold value A1.

FIG. 4c) shows a plot 1020 of the oscillation amplitude A in the case illustrated in FIG. 3. The oscillation amplitude A is approximately constant with a small amount that is less than a second threshold value A2 prior to the point in time t0. After the point in time t0, the oscillation amplitude is larger, and in fact also greater than a third threshold value A3, which in turn is greater than the second threshold value A2. The time duration between the point in time at which the oscillation amplitude A first exceeds the second threshold value A2 and the point in time at which the oscillation amplitude A first exceeds the third threshold value A3, is very short. In FIG. 4c), the increase in the oscillation amplitude A is depicted as approximately instantaneous.

FIG. 4d) shows a plot 1030 of the oscillation amplitude A for a case in which no error is present up to the point in time t0 as well as in the case illustrated in FIG. 4c). A sulfation of the battery 200, which is designed as a lead storage battery occurs at the point in time t0. The oscillation amplitude A is less than the second threshold value A2 prior to the point in time t0. Due to the sulfation, the capacity of the batter 200 is reduced which leads to an increase in the oscillation amplitude A. The oscillation amplitude A exceeds the second threshold value and the third threshold value A3. The temporal distance ΔT between the second threshold value A2 being first exceeded and the third threshold value A3 being first exceeded is large with a suitable selection of these threshold values, typically in the range of months.

In order to detect and differentiate between the errors illustrated in FIGS. 4c) and 4d), provision can therefore be made for a check to initially be made whether the oscillation amplitude A is initially less than the second threshold value A2 and greater than the second threshold value A2 from a later point in time forward.

If this is the case, a check is made whether the oscillation amplitude A is also greater than the third threshold value A3. If this too is the case, it is detected that a battery-less operation is present. It is then possible, that (e.g. in the generator controller 140) control parameters are kept for the battery-less operation, which cause reduced dynamics of the generator voltage U+ in order to compensate for the absent buffering capacity of the battery 200 and to reduce the fluctuation behavior of the generator voltage U+ illustrated in FIG. 3.

If, on the other hand, the oscillation amplitude A is indeed greater than the second threshold value A2 and not greater than the third threshold value A3, the point in time is determined from which the oscillation amplitude A likewise exceeds the third threshold value A3, and the temporal distance ΔT is determined. It goes without saying that the person skilled in the art can provide measures here to compensate for a fluctuation in the oscillation amplitude. For example, the plot of the oscillation amplitude A can be low-pass filtered or a debouncing can be provided.

If the temporal distance is greater than a first predeterminable minimum distance, a decision is made that sulfation is present. In this case, it is possible that the generator sets the generator voltage U+ such that the sulfation is reduced. It is, for example, possible that the generator voltage U+ is raised in a pulsed manner, i.e. a periodic behavior of the generator voltage U+ is predetermined in which the generator voltage U+ initially remains at a normal value for a first time period and subsequently assumes an increased value for a second time period before said generator voltage subsequently again assumes the normal value. The first and second time period can typically be time periods between one and ten seconds.

It is also possible that a status flag is set that indicates that the presence of sulfation has been detected. This status flag can be made to be read out via a diagnostic interface, for example by said status flag being transmitted to an engine control device, which has a diagnostic interface at the disposal thereof.

Provision can be made in this case for the battery 200 to be charged in a pulsed manner during a service operation in order to reduce the sulfation.

If the temporal distance is not greater than the first predeterminable minimum distance, however, also smaller than a second predeterminable minimum distance which is smaller than the first predeterminable minimum distance, a decision is then made that the battery-less operation is present and the method can proceed as described above.

The invention claimed is:

1. A method for detecting a state of an electric system (150) of a motor vehicle including a battery (200), the electric system (150) comprising a generator unit that includes an electric machine (100) with a rotor winding (110) and a stator winding (120), and a rectifier (130) which is connected to the electric machine (100) via which the electric system (150) is connected to the electric machine (100); the method comprising:
   determining an oscillation frequency contribution of a generator voltage from the electric machine (100) within an excitation current (IE) of the rotor winding (110);
   comparing the oscillation frequency contribution to a predetermined threshold value, the predetermined threshold being based on a length of a supply line between the electric machine (100) and the battery (200);
   concluding that there is an interruption in the supply line when the oscillation frequency contribution is greater than the predetermined threshold value;
   determining an oscillation amplitude (A) of the oscillation frequency contribution in an excitation current (IE) flowing through the rotor winding (110) of the electric machine (100);
   determining whether the interruption in the line is due to a sulfation of the battery (200) of the electric system (150) based on a rate of increase in the oscillation amplitude (A) of the oscillation frequency contribution; and
   adjusting a control parameter of the generator unit to a first predetermined control parameter when the interruption in the line is determined to be due to sulfation of the battery (200).

2. The method according to claim 1, wherein the relative distance is determined based on a size of the oscillation amplitude (A).

3. The method according to claim 2, wherein the control parameter for controlling the generator unit is selected in accordance with the determined length of the supply line.

4. The method according to claim 1, the method further comprising determining whether the interruption in the supply line is due to the supply line is defective based on the rate of increase of the oscillation amplitude (A).

5. The method according to claim 4, wherein, when the oscillation amplitude (A) sharply increases, the supply line is determined to be defective.

6. The method according to claim 5, further comprising detecting that the oscillation amplitude (A) sharply increases when a length of a time period (ΔT) between a point in time at which the oscillation amplitude (A) exceeds a second threshold value (A2) and a further point in time, at which the oscillation amplitude (A) exceeds a larger third threshold value (A3), is less than a second minimum temporal distance.

7. The method according to claim 5, the method further comprising adjusting the control parameter of the generator unit to a second predetermined control parameter when the interruption in the line is determined to be due to the supply line being defective.

8. The method according to claim 1, wherein sulfation of the battery (200) is determined to be present when the oscillation amplitude (A) slowly increases.

9. The method according to claim 7, the method further comprising detecting that the oscillation amplitude (A) slowly increases when a length of a time period (ΔT) between a point in time at which the size of the oscillation amplitude (A) exceeds a second threshold value (A2) and a further point in time, at which the oscillation amplitude (A) exceeds a larger third threshold value (A3), is greater than a first minimum temporal distance.

10. The method according to claim 8, the method further comprising charging the battery (200) in a pulsed manner when it has been determined that sulfation is present.

11. An arithmetic unit (140), which is equipped to carry out a method according to claim 1.

12. A computer program which carries out the method according to claim 1 when said program is executed on the arithmetic unit (140).

13. A non-transitory machine-readable storage medium having a computer program stored thereon which induces an arithmetic unit (140) to carry out the method according to claim 1 if said program is executed on the arithmetic unit (140).

14. The arithmetic unit (140) according to claim 11, wherein the arithmetic unit (140) is a generator controller.

* * * * *